(12) United States Patent
Chandra et al.

(10) Patent No.: US 10,492,290 B2
(45) Date of Patent: Nov. 26, 2019

(54) CIRCUIT BOARD PAD MOUNTING ORIENTATION SYSTEM

(71) Applicant: Dell Products L.P., Round Rock, TX (US)

(72) Inventors: Umesh Chandra, Santa Cruz, CA (US); Chun-Lin Liao, Taipei (TW); Bhyrav M. Mutnury, Austin, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 15/910,773

(22) Filed: Mar. 2, 2018

(65) Prior Publication Data

US 2019/0274213 A1    Sep. 5, 2019

(51) Int. Cl.
*H05K 3/32*     (2006.01)
*H05K 1/02*     (2006.01)
*H05K 1/11*     (2006.01)
*H05K 3/30*     (2006.01)
*H05K 1/18*     (2006.01)

(52) U.S. Cl.
CPC ......... *H05K 1/0228* (2013.01); *H05K 1/0266* (2013.01); *H05K 1/111* (2013.01); *H05K 1/181* (2013.01); *H05K 3/303* (2013.01); *H05K 2201/094* (2013.01); *H05K 2201/097* (2013.01); *H05K 2201/09381* (2013.01); *H05K 2201/09727* (2013.01); *H05K 2201/10159* (2013.01); *H05K 2201/10189* (2013.01); *H05K 2201/10356* (2013.01)

(58) Field of Classification Search
CPC .............................. H05K 1/0266; H05K 3/32
USPC ......................................................... 257/797
See application file for complete search history.

(56) References Cited

U.S. PATENT DOCUMENTS

| 7,061,127 | B2* | 6/2006 | Hashimoto | ......... H01L 23/3114 |
| | | | | 257/797 |
| 2006/0014438 | A1 | 1/2006 | Ragnier | |
| 2009/0291593 | A1 | 11/2009 | Atkinson et al. | |
| 2011/0188283 | A1* | 8/2011 | Chevallier | ............... G11C 5/02 |
| | | | | 365/51 |

* cited by examiner

*Primary Examiner* — Jeremy C Norris
(74) *Attorney, Agent, or Firm* — Haynes and Boone, LLP

(57) ABSTRACT

A circuit board pad mounting orientation system includes a board. A signal transmission line is included on the board. A plurality of connector pads are positioned on the board. At least one connector pad receives the signal transmission line adjacent a first end of that connector pad. At least one connector pad includes a second end that provides a reduction in a width of that connector pad to indicate a mounting orientation for coupling to the connector pad that receives the signal transmission line. In a specific example, a first connector pad receives the signal transmission line, includes the first end, and includes the second end that is opposite the first connector pad from the first end and that provides the reduction in the width of the first connector pad to indicate the mounting orientation for coupling to the first connector pad.

20 Claims, 19 Drawing Sheets

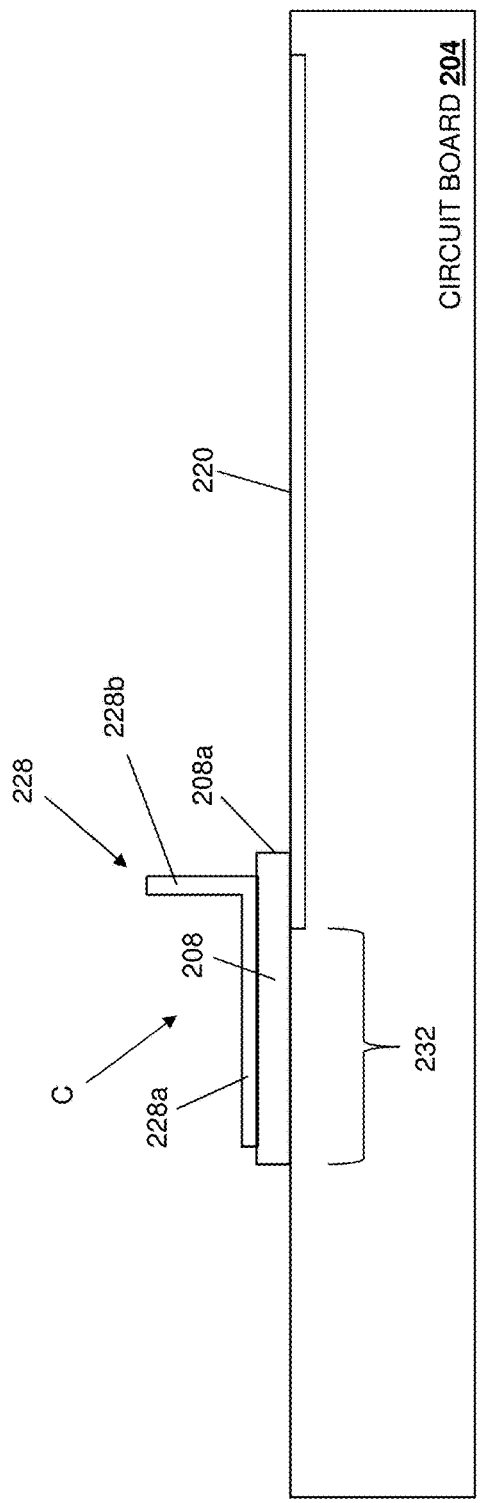

CIRCUIT BOARD PAD MOUNTING ORIENTATION SYSTEM

BACKGROUND

The present disclosure relates generally to information handling systems, and more particularly to mounting coupling members to information handling system circuit board pads in a desired orientation.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically include circuit boards with connector pads that are utilized to mount connectors to the circuit board, and those connectors are then utilized to connect subsystems utilized with the information handling system via the circuit board. Furthermore, as data transmission speeds in information handling systems increase, connectors such as Surface Mount Technology (SMT) connectors tend to be the connectors of choice for relatively high speed signal applications due to their signal integrity benefits resulting from, for example, their enablement of back-drilling, shielding of ground vias, choice of desired signals, and ground via assignments. However, other relatively high speed signal applications may utilize cables directly soldered to the connector pads on the circuit board in order, for example, to avoid paddle board and/or other connection impairments. Conventionally, the orientation of the connectors and cables when mounted to the connector pads has been unimportant. However, the inventors of the present disclosure have discovered that subtle parasitic effects can be introduced at relatively high data transmission speeds in response to particular connector and cable mounting orientations. For example, depending on how the signal transmission line connects to the connector pad, the orientation of the connector or cable in connecting to the connector pad can result in the connector pad and/or a portion of the lead frame/cable a signal transmission path that is "dangling", "unused", or otherwise "open", and that may act as a resonator (e.g., at quarter wavelengths) that can compromise the signal integrity of the communication channel.

Accordingly, it would be desirable to a provide circuit board pad mounting orientation system.

SUMMARY

According to one embodiment, an Information Handling System (IHS) includes a circuit board; a processing system mounted to the circuit board; a memory system mounted to the circuit board and coupled to the processing system through the circuit board; a signal transmission line included on the circuit board and coupled to the processing system; and a plurality of connector pads that are positioned on the circuit board and that include: at least one connector pad that receives the signal transmission line adjacent a first end of that connector pad; and at least one connector pad that includes a second end that provides a reduction in a width of that connector pad to indicate a mounting orientation for coupling to the connector pad that receives the signal transmission line.

BRIEF DESCRIPTION OF THE DRAWINGS

FIG. 2E is a schematic cross-sectional view illustrating an embodiment of a connector connected to the conventional connector pad of FIG. 2B in a second orientation.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
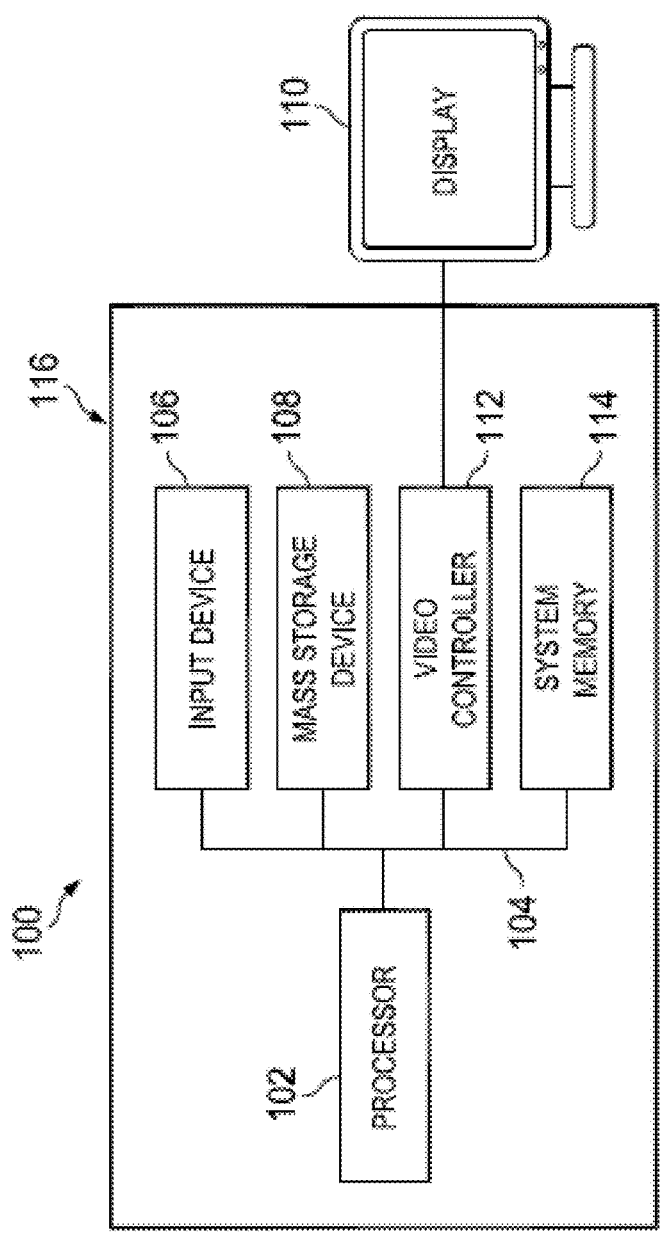
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
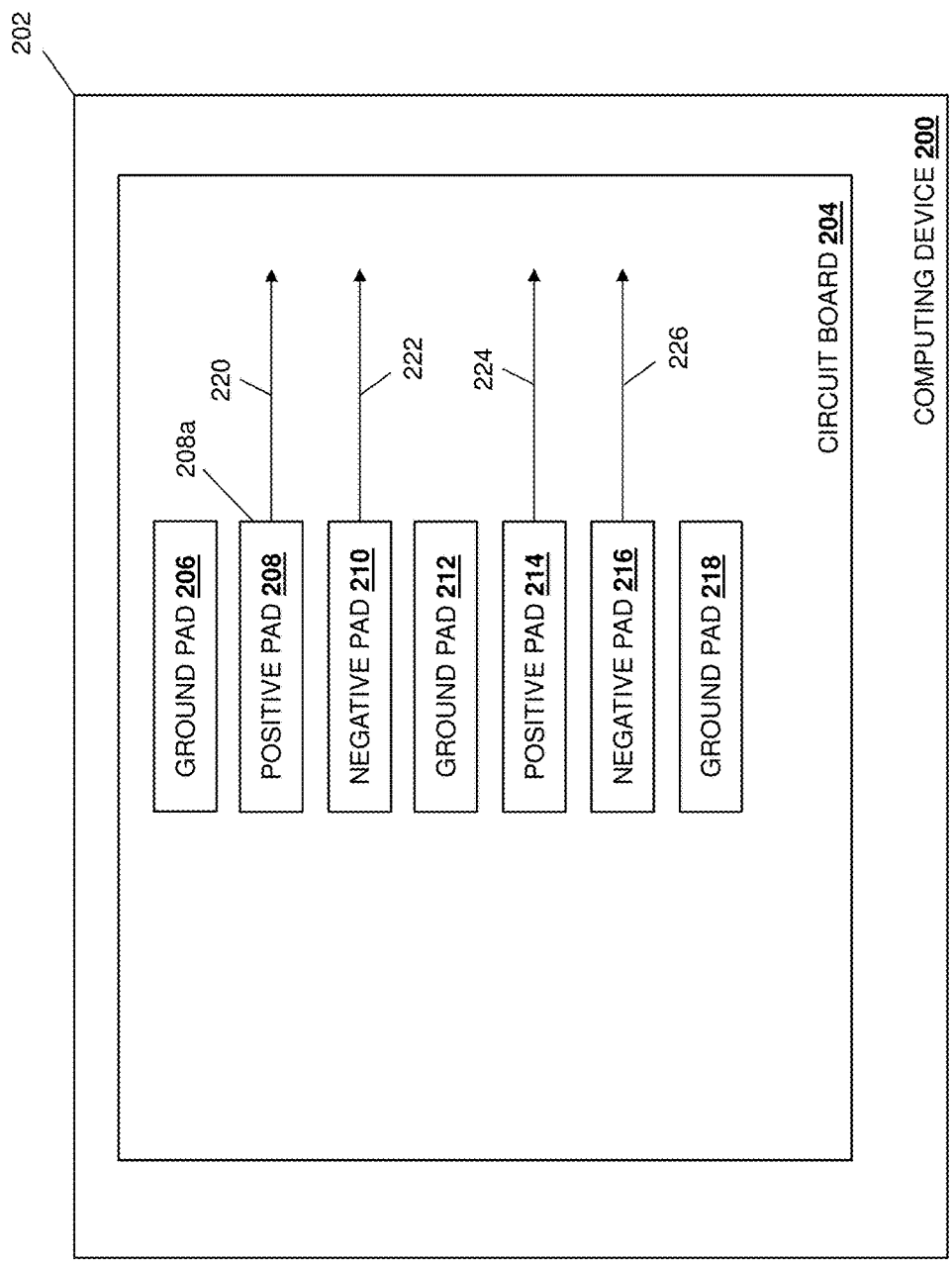
FIG. 2A is a schematic top view illustrating an embodiment of a computing device including a circuit board having conventional connector pads.

Referring now to FIG. 2A, an embodiment of a conventional computing device 200 is illustrated that may be the IHS 100 discussed above with reference to FIG. 1, and/or may include some or all of the components of the IHS 100. In the illustrated embodiment, the computing device 200 includes a chassis 202 that houses the components of the computing device 200, only some of which are illustrated in FIG. 2A. In the embodiment of FIG. 2A, the chassis 202 is illustrated as housing a circuit board 204 including a plurality of conventional connector pads such as, for example, the ground pad 206, the positive pad 208, the negative pad 210, the ground pad 212, the positive pad 214, the negative pad 216, and the ground pad 218 illustrated in FIG. 2A. The circuit board 204 includes a plurality of signal transmission lines including the signal transmission line 220 extending from positive pad 208, the signal transmission line 222 extending from negative pad 210, the signal transmission line 224 extending from positive pad 214, and the signal transmission line 226 extending from negative pad 216, as illustrated in FIG. 2A.

Figure 2B:
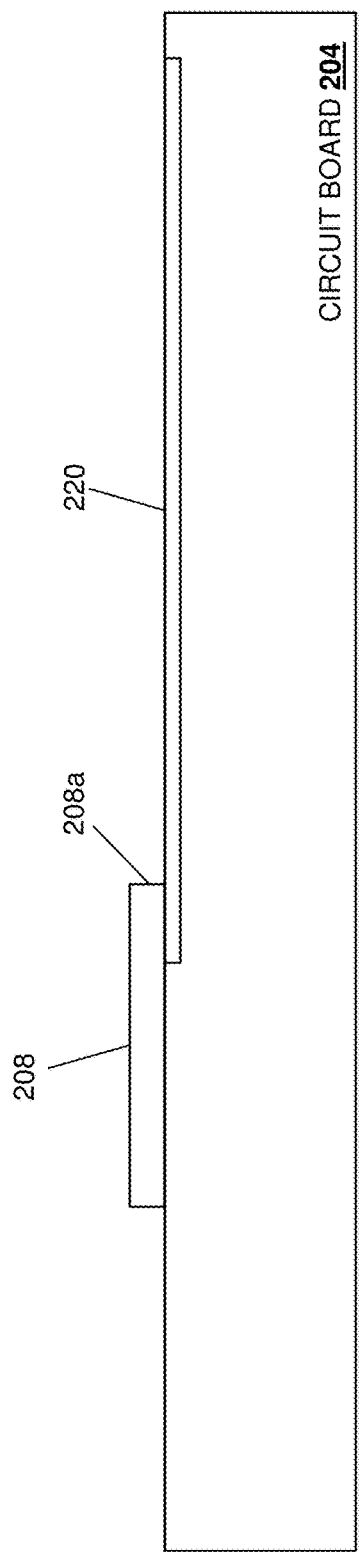
FIG. 2B is a schematic cross-sectional view illustrating an embodiment of a conventional connector pad of FIG. 2A.

With reference to FIG. 2B, the positive pad 208 and signal transmission line 220 included on the circuit board 204 of FIG. 2A are illustrated in more detail. However, one of skill in the art in possession of the present disclosure will recognize that the pad and signal transmission line illustrated in FIG. 2B may be any of the negative pad 210/signal transmission line 222, the positive pad 214/signal transmission line 224, and/or the negative pad 216/signal transmission line 226 as well. As can be seen in FIG. 2B, the signal transmission line 220 extends through the circuit board 204, and is received by the positive pad 208 adjacent an end 208a of the positive pad 208. As discussed above, connectors, cables, and/or other coupling members may be mounted to the connector pads on the circuit board 204 in order to couple those coupling members to the signal transmission lines, and subsequently enable devices, components, and/or other computing device subsystems to be connected to those coupling members in order to provide for communication with other devices, components, and/or computing systems that are connected to the circuit board (e.g., via the signal transmission lines.)

Figure 2C:
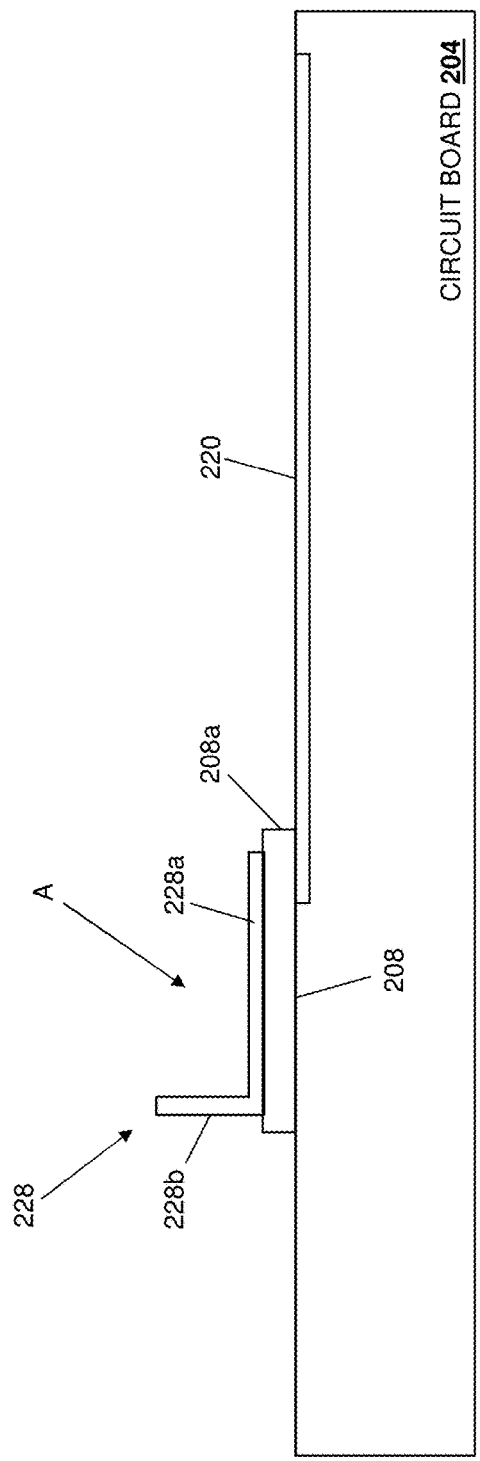
FIG. 2C is a schematic cross-sectional view illustrating an embodiment of a connector connected to the conventional connector pad of FIG. 2B in a first orientation.

For example, FIG. 2C illustrates how a connector may be mounted to the positive pad 208 in a first mounting orientation A. In the illustrated embodiment, a connector lead frame 228 that may be included on, for example, an SMT connector, includes a mounting portion 228a that engages the positive pad 208, and a lead portion 228b that extend substantially perpendicularly from the mounting portion 228a. One of skill in the art will recognize that an SMT connector may include a variety of other SMT components connected to the connector lead frame 228, but those SMT components have been omitted for clarity. As can be seen, in the first mounting orientation A, the mounting portion 228a of the connector lead frame 228 is mounted to the positive pad 208 such that lead portion 228b is located opposite the positive pad 208 from the end 208a of the positive pad 208 that receives the signal transmission line 220.

Figure 2D:
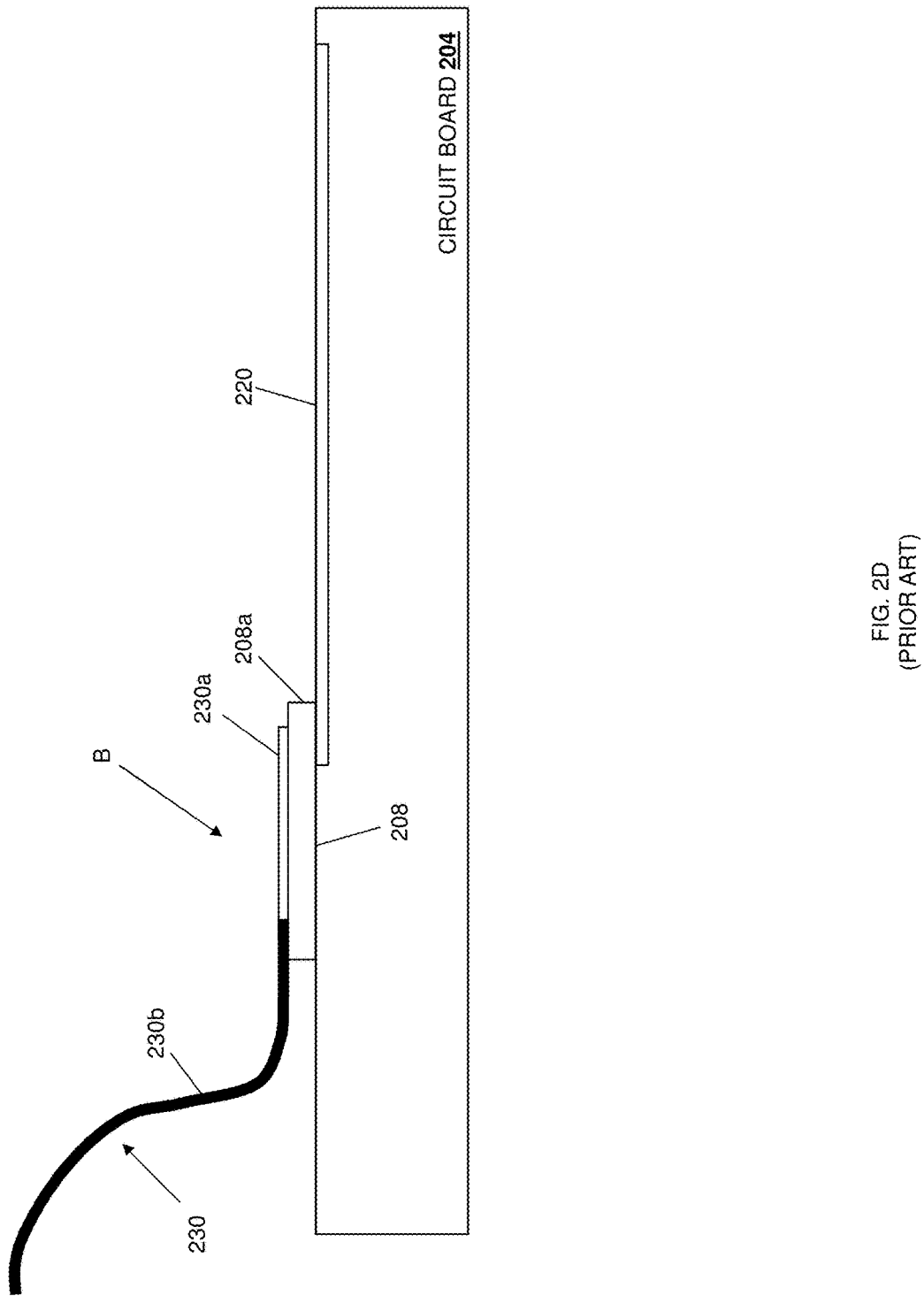
FIG. 2D is a schematic cross-sectional view illustrating an embodiment of a cable connected to the conventional connector pad of FIG. 2B in a first orientation.

Referring now to FIG. 2D, an example is illustrated of how a cable may be mounted to the positive pad 208 in a first mounting orientation B. In the illustrated embodiment, an exposed cable end 230a of the cable 230 engages the positive pad 208, and a shielded cable portion 230b of the cable 230 extends from the exposed cable end 230a. One of skill in the art will recognize that the cable 230 may be connected to a variety of components, but those components have been omitted for clarity. As can be seen, in the first mounting orientation B, the exposed cable end 230a of the cable 230 is mounted to the positive pad 208 such that shielded cable portion 230b extends from the positive pad 208 opposite the end 208a of the positive pad 208 that receives the signal transmission line 220.

Figure 2F:
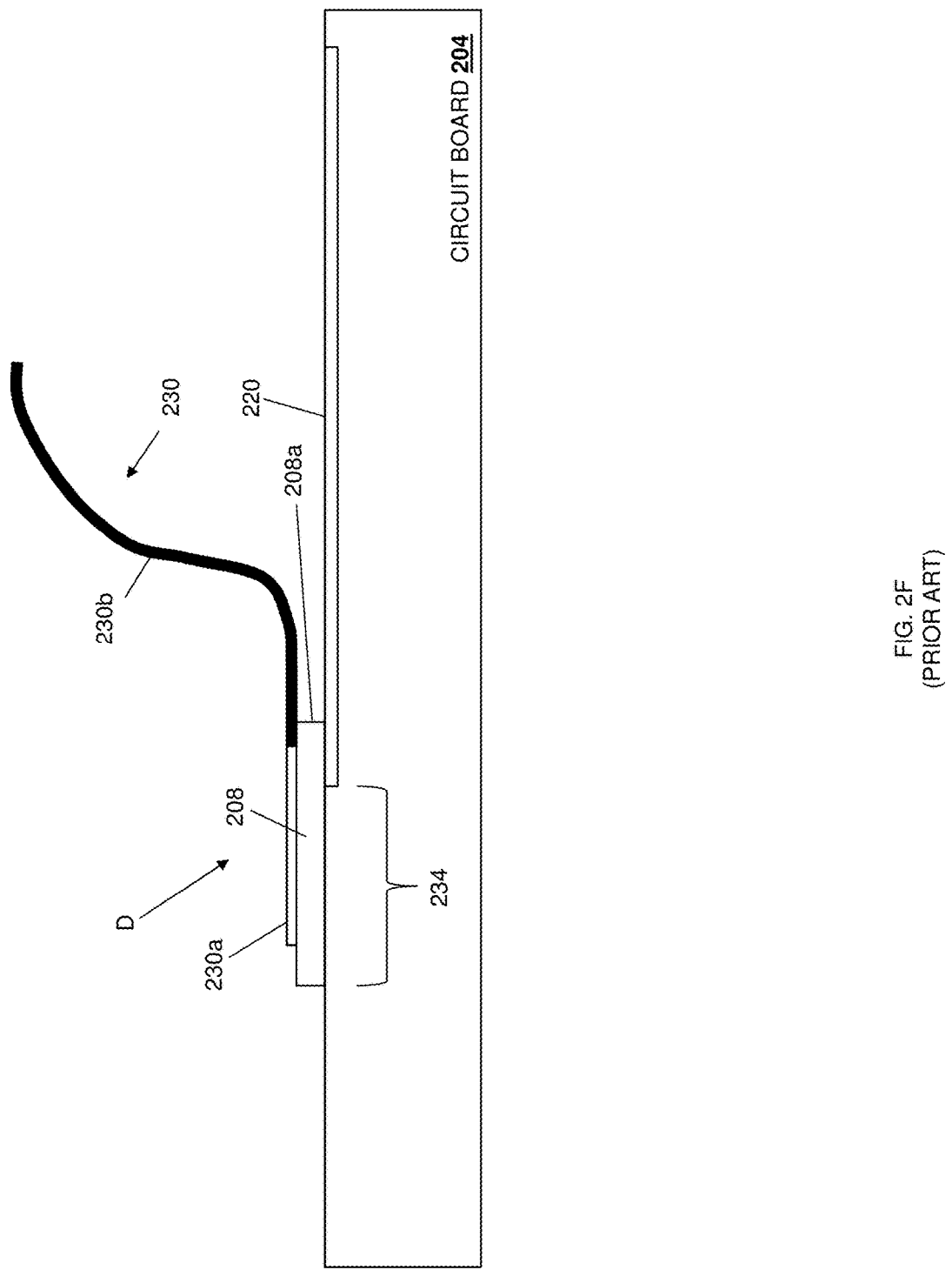
FIG. 2F is a schematic cross-sectional view illustrating an embodiment of a cable connected to the conventional connector pad of FIG. 2B in a second orientation.

Referring now to FIG. 2E, an example is illustrated of how a connector may be mounted to the positive pad 208 in a second mounting orientation C. As in the embodiment discussed above with reference to FIG. 2C, the connector lead frame 228 includes the mounting portion 228a that engages the positive pad 208, and the lead portion 228b that extend substantially perpendicularly from the mounting portion 228a. However, in the second mounting orientation C, the mounting portion 228a of the connector lead frame 228 is mounted to the positive pad 208 such that lead portion 228b is located adjacent the end 208a of the positive pad 208 that receives the signal transmission line 220. Referring now to FIG. 2F, an example is illustrated of how a cable may be mounted to the positive pad 208 in a second mounting orientation D. As in the embodiment discussed above with reference to FIG. 2D, the exposed cable end 230a of the cable 230 engages the positive pad 208, and the shielded cable portion 230b of the cable 230 extends from the exposed cable end 230a. However, in the second mounting orientation D, the exposed cable end 230a of the cable 230 is mounted to the positive pad 208 such that shielded cable portion 230b extends adjacent the end 208a of the positive pad 208 that receives the signal transmission line 220.

Figure 3A:
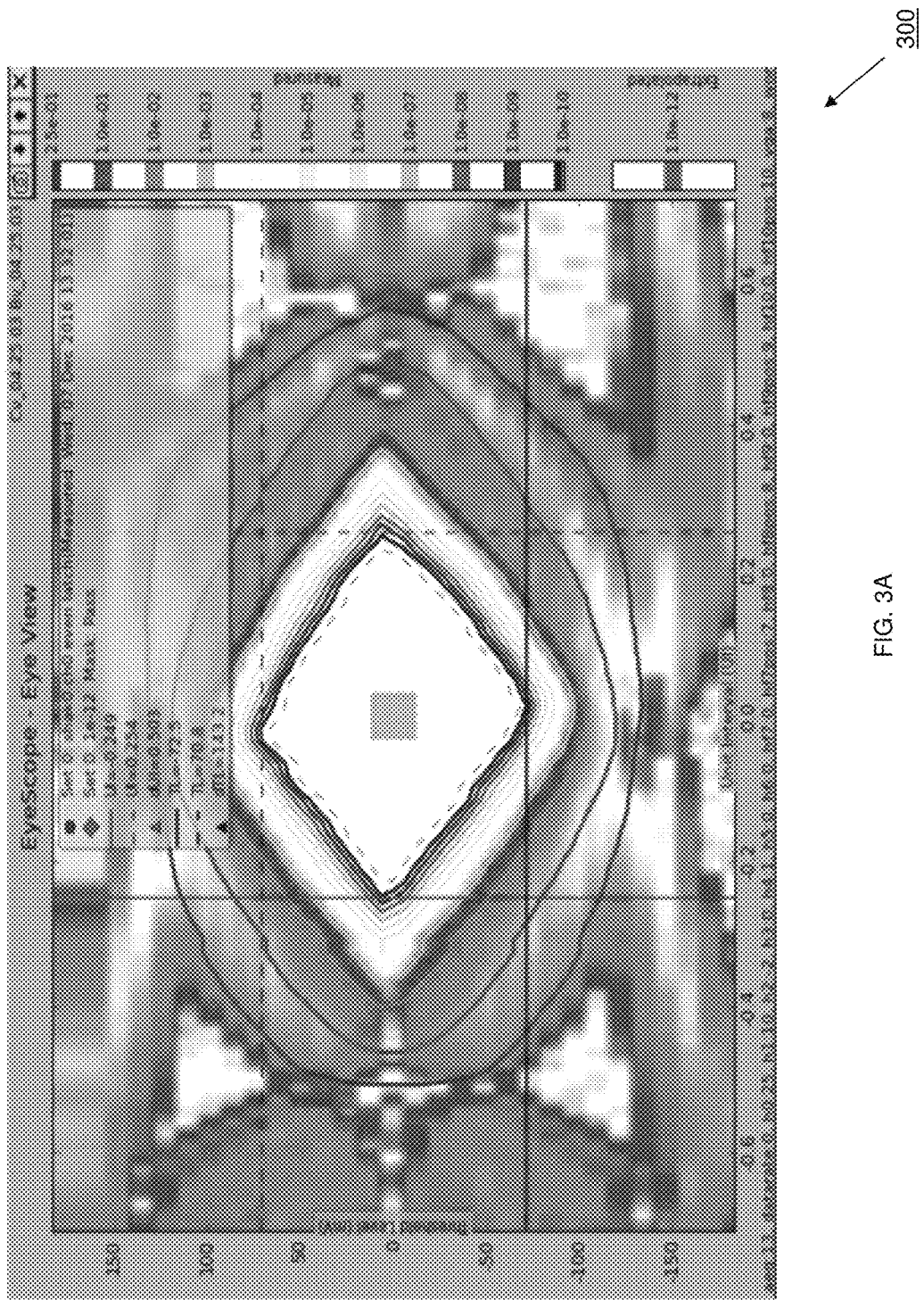
FIG. 3A is a chart illustrating an eye diagram for signals transmitted via the connector mounted to the connector pad in the first orientation of FIG. 2C.
Figure 3B:
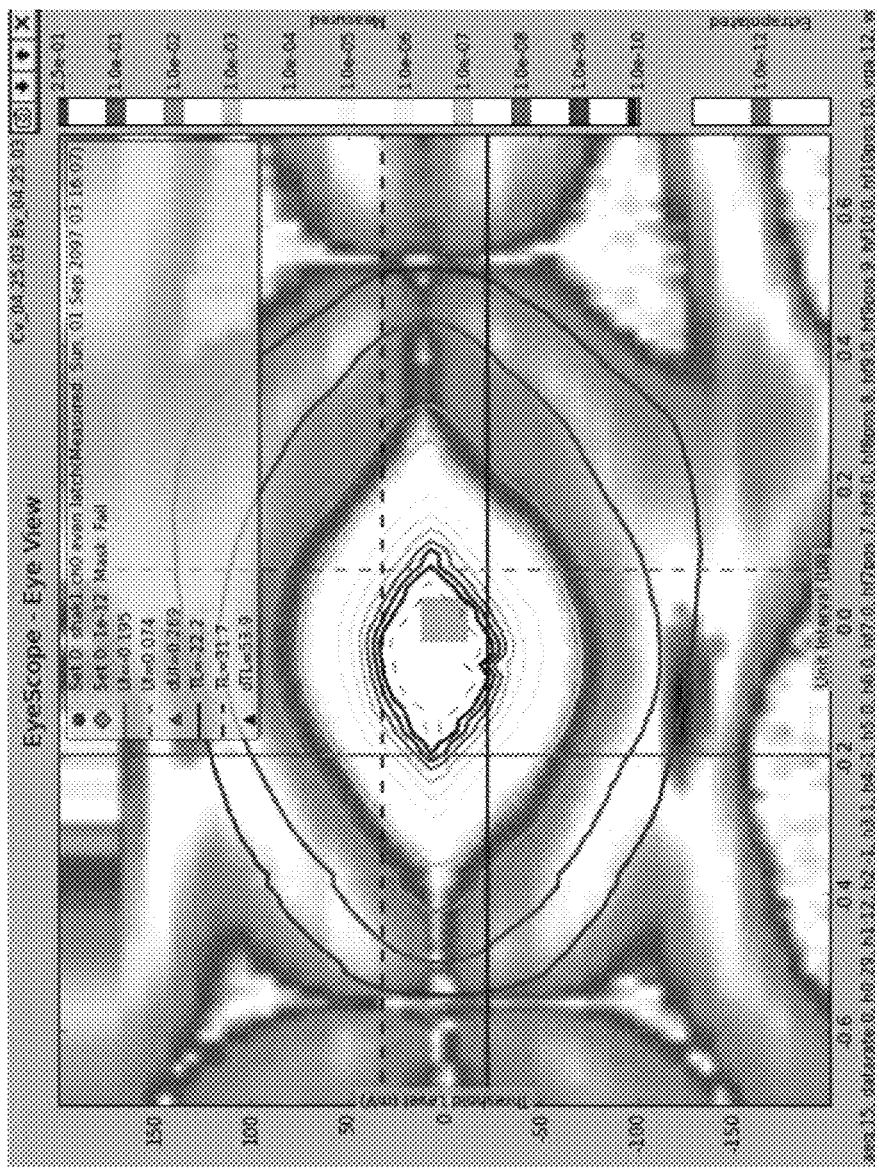
FIG. 3B is a chart illustrating an eye diagram for signals transmitted via the connector mounted to the connector pad in the second orientation of FIG. 2E.

Referring now to FIGS. 3A and 3B, eye diagrams are provided of signals transmitted using the connector/connector pad in the different mounting orientations illustrated in FIGS. 2C and 2E. Specifically, FIG. 3A illustrates an eye diagram 300 of signals provided via the connector lead frame 228 and positive pad 208 mounted in the first mounting orientation A of FIG. 2C, while FIG. 3B illustrates an eye diagram 302 of signals provided via the connector lead frame 228 and positive pad 208 mounted in the second mounting orientation C of FIG. 2E. One of skill in the art in possession of the present disclosure will appreciate that the eye diagram 300 is representative of a signal with superior characteristics relative to the signal represented by the eye diagram 302, and it has been found that the second mounting orientation C of the connector lead frame 228 to the positive pad 208 is responsible for those degraded signal characteristics. For example, with reference to FIG. 2E, it can be seen that the second mounting orientation C of the connector lead frame 228 to the positive pad 208 provides a portion of the positive pad 208 and the mounting portion 228a of the connector lead frame 228 that extend away from the end 208a of the positive pad 208, and which provide an open portion 232 of the transmission path that can resonate at high signal transmission speeds. In other words, high speed signals may be transmitted through the signal transmission line 220 to the positive pad 208, primarily through the portion of the positive pad 208 adjacent its end 208a, and then primarily through the lead portion 228b of the connector lead frame 228. As such, the high speed signals may primarily bypass the open portion 232 of the transmission path that includes the remaining portion of the positive pad 208 and the mounting portion 228a of the connector lead frame 228, and that open portion 232 of the transmission path has been found to produce resonance that degrades high speed signals, as illustrated in the eye diagram 302.

Figure 4:
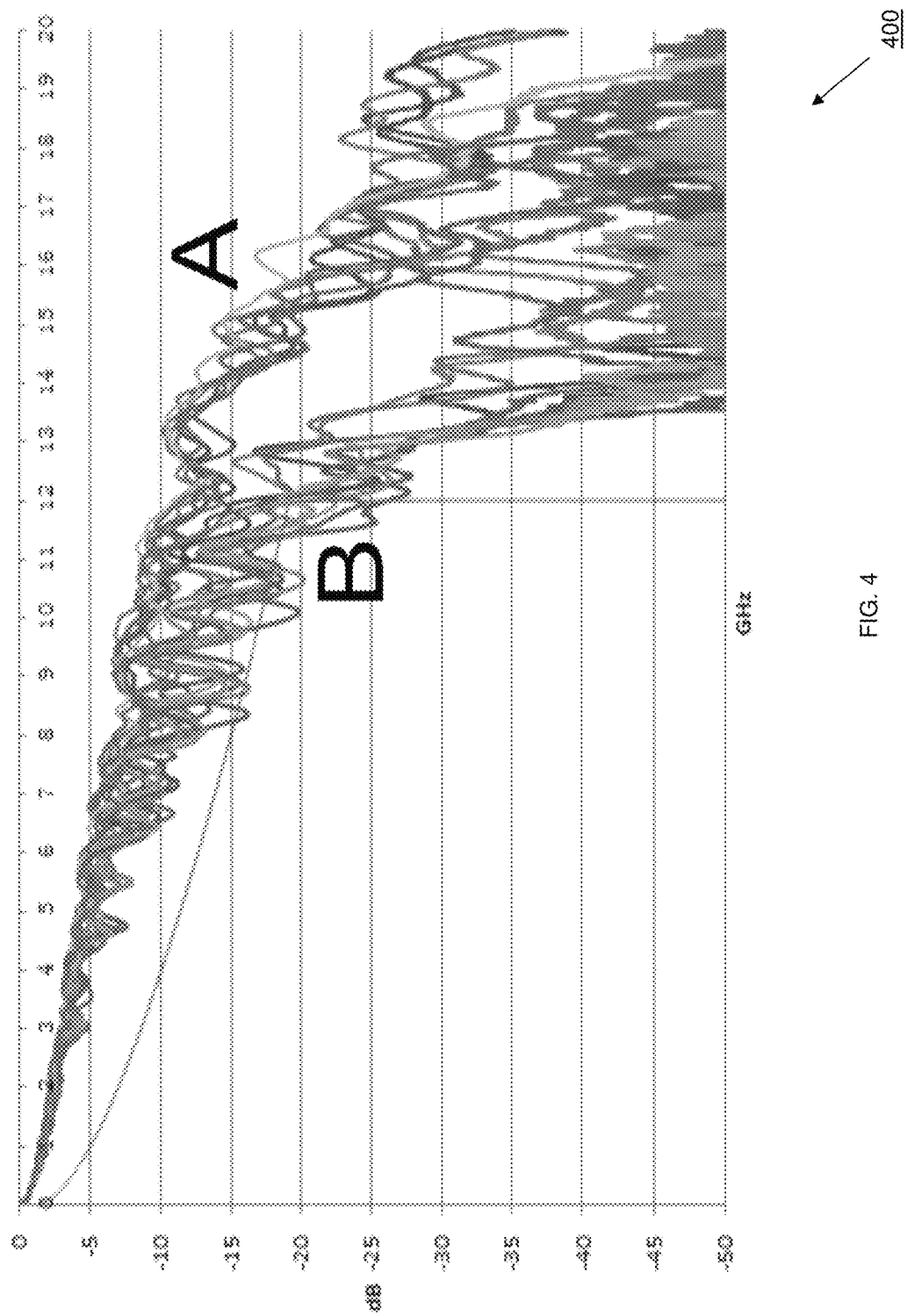
FIG. 4 is a chart illustrating insertion losses associated with the cable mounted to the connector pad in the first orientation of FIG. 2D, and the cable mounted to the connector pad in the second orientation of FIG. 2F.

Referring now to FIG. 4, a chart 400 of insertion losses is provided for signals transmitted using the cable/connector pad in the different mounting orientations illustrated in FIGS. 2D and 2F. Specifically, the insertion loss chart of FIG. 4 illustrates insertion losses for cables (marked as "A" in the chart) similar to the cable 230 when mounted to the positive pad 208 the first mounting orientation B of FIG. 2D, as well as insertion losses for cables (marked as "B" in the chart) similar to the cable 230 when mounted to the positive pad 208 the second mounting orientation D of FIG. 2F. In the experimental embodiment that produced the chart 400, the cable insertion losses marked as "A" were low enough to satisfy a signal specification, while the cable insertion losses marked as "B" violated that signal specification, and it has been found that the second mounting orientation D of the exposed cable end 230a of the cable 230 to the positive pad 208 is responsible for those degraded signal characteristics. For example, with reference to FIG. 2F, it can be seen that the second mounting orientation D of the exposed cable end 230a to the positive pad 208 provides a portion of the positive pad 208 and the exposed cable end 230a of the cable 230 that extend away from the end 208a of the positive pad 208, and provide an open portion 234 of the transmission path that can resonate at high signal transmission speeds. In other words, high speed signals may be transmitted through the signal transmission line 220 to the positive pad 208, and then primarily through the portion of the exposed cable end 230a of the cable 230 adjacent the end 208a. As such, the high speed signals may primarily bypass the open portion 234 of the transmission path that includes the remaining portion of the positive pad 208 and the remaining portion of the exposed cable end 230a of the cable 230, and that open portion 234 of the transmission path has been found to produce resonance that degrades high speed signals, as illustrated in by the insertion losses of the cables marked "B" in the chart 400.

Figure 5A:
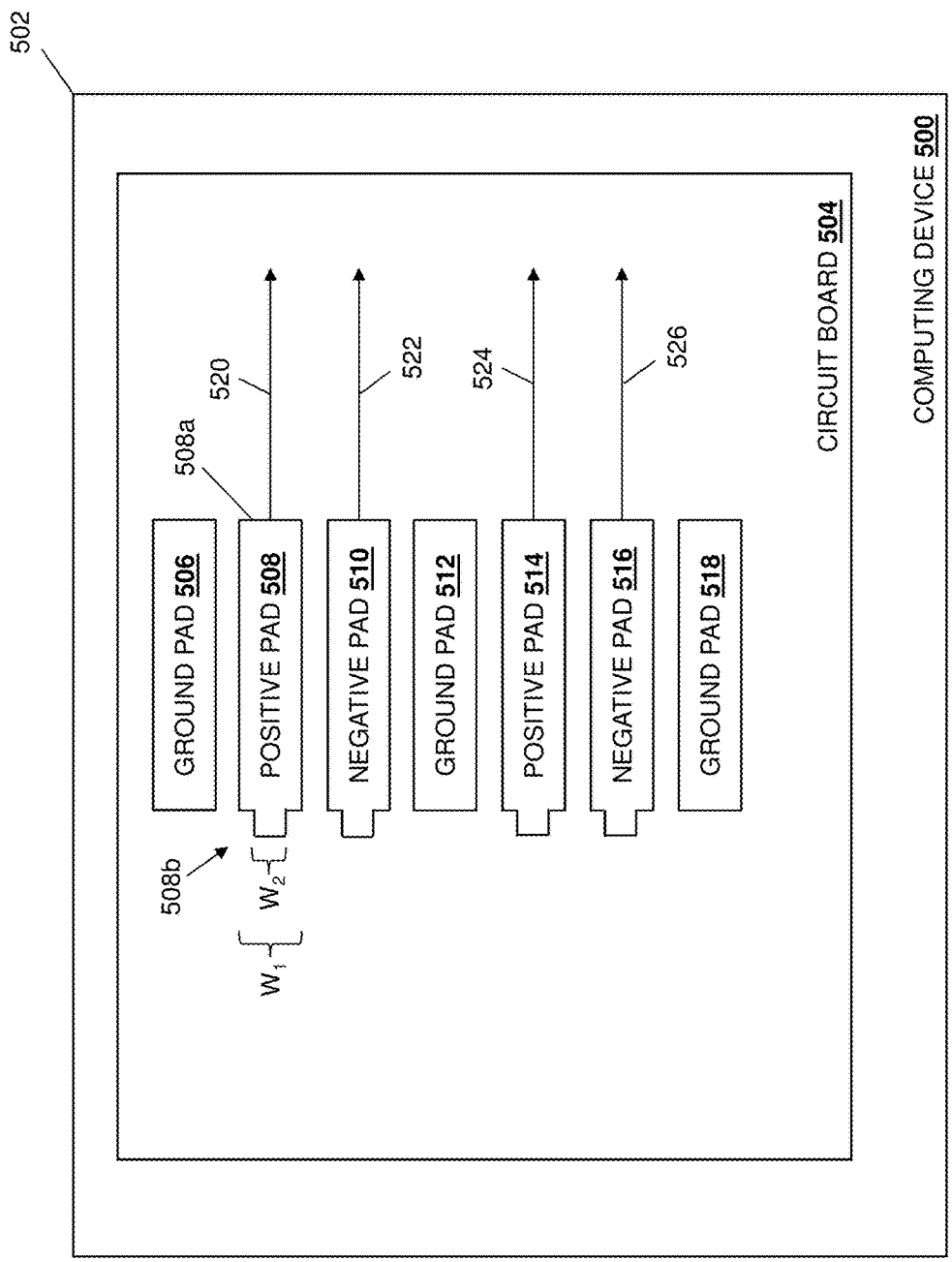
FIG. 5A is a schematic top view illustrating an embodiment of a computing device including a circuit board having connector pads according to the teachings of the present disclosure.

Referring now to FIG. 5A, an embodiment of a computing device 500 of the present disclosure is illustrated that may be the IHS 100 discussed above with reference to FIG. 1, and/or may include some or all of the components of the IHS 100. For example, the computing device 500 may include a server computing device, a storage computing device, a networking computing device, a laptop/notebook computing device, a desktop computing device, a tablet computing device, a mobile computing device, and/or a variety of other computing devices that would be apparent to one of skill in the art in possession of the present disclosure. In the illustrated embodiment, the computing device 500 includes a chassis 502 that houses the components of the computing device 500, only some of which are illustrated in FIG. 2. In the embodiment of FIG. 5A, the chassis 502 is illustrated as housing a circuit board 504 including a plurality of connector pads that are provided according to the teaching of the present disclosure. For example, in the illustrated embodiment those connector pads include the ground pad 506, the positive pad 508, the negative pad 510, the ground pad 512, the positive pad 514, the negative pad 516, and the ground pad 518 seen in FIG. 5A. The circuit board 504 includes a plurality of signal transmission lines including the signal transmission line 520 extending from positive pad 508, the signal transmission line 522 extending from negative pad 510, the signal transmission line 524 extending from positive pad 514, and the signal transmission line 526 extending from negative pad 516, as illustrated in FIG. 5A.

Figure 5B:
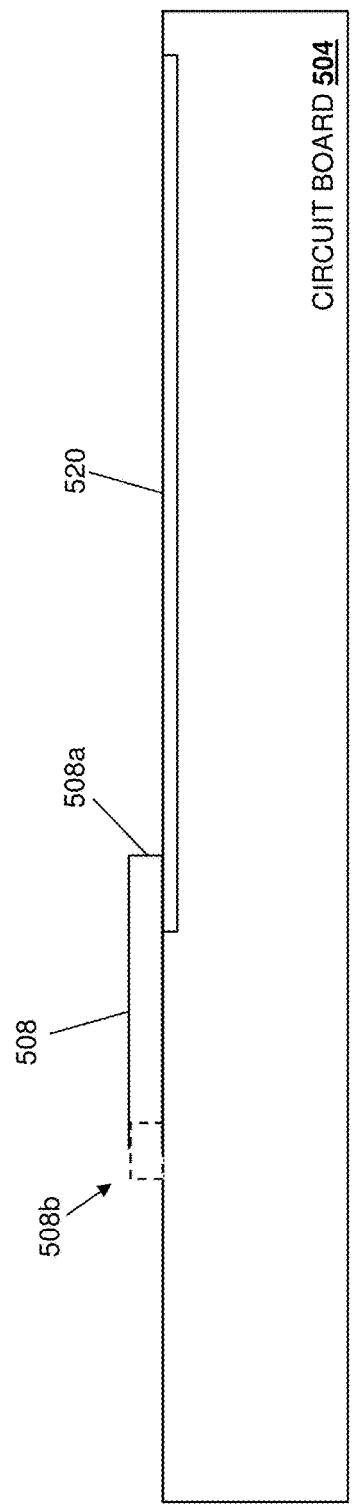
FIG. 5B is a schematic cross-sectional view illustrating an embodiment of a connector pad of FIG. 5A.

With reference to FIGS. 5A and 5B, the positive pad 508 and signal transmission line 520 included on the circuit board 504 are illustrated in more detail. However, one of skill in the art in possession of the present disclosure will recognize that the pad and signal transmission line illustrated in FIG. 5B may be any of the negative pad 510/signal transmission line 522, the positive pad 514/signal transmission line 524, and/or the negative pad 516/signal transmission line 526 as well. As can be seen in FIG. 5B, the signal transmission line 520 extends through the circuit board 504, and is received by the positive pad 508 adjacent an end 508a of the positive pad 508. Furthermore, the positive pad 508 also includes an end 508b that is located opposite the positive pad 508 from the end 508a that receives the signal transmission line 520. While the positive pad 508 and the signal transmission line 520 are illustrated as included on an outer surface of the circuit board 504, the connector pads and/or signal transmission lines may be provided on one or more internal layers of the circuit board while remaining within the scope of the present disclosure as well.

As discussed in further detail below, the end 508b of the positive pad 508 is provided with irregular dimensions and, in particular, dimensions that are different than the end 508a of the positive pad 508, in order to indicate a desired mounting orientation for coupling to the positive pad 508. In the specific example illustrated in FIG. 5A, the end 508b provides a reduction in width of the positive pad 508 from a maximum width $W_1$ to a reduced width $W_2$ by including a smaller square-shaped or rectangular shaped member that extends from the center of the rectangular-shaped positive pad 508 opposite the end 508a, although one of skill in the art in possession of the present disclosure will recognize that other irregularities or reduced-width ends on connector pads will fall within the scope of the present disclosure as well. Furthermore, one of skill in the art in possession of the present disclosure will recognize that the negative pad 510, the positive pad 514, and the negative pad 516 are illustrated with irregular ends that may be substantially similar to the end 508b of the positive pad 508 described above, and that any other connector pads on the circuit board 504 may be provided with an irregular end according to any of the teachings of the present disclosure as well.

Figure 6:
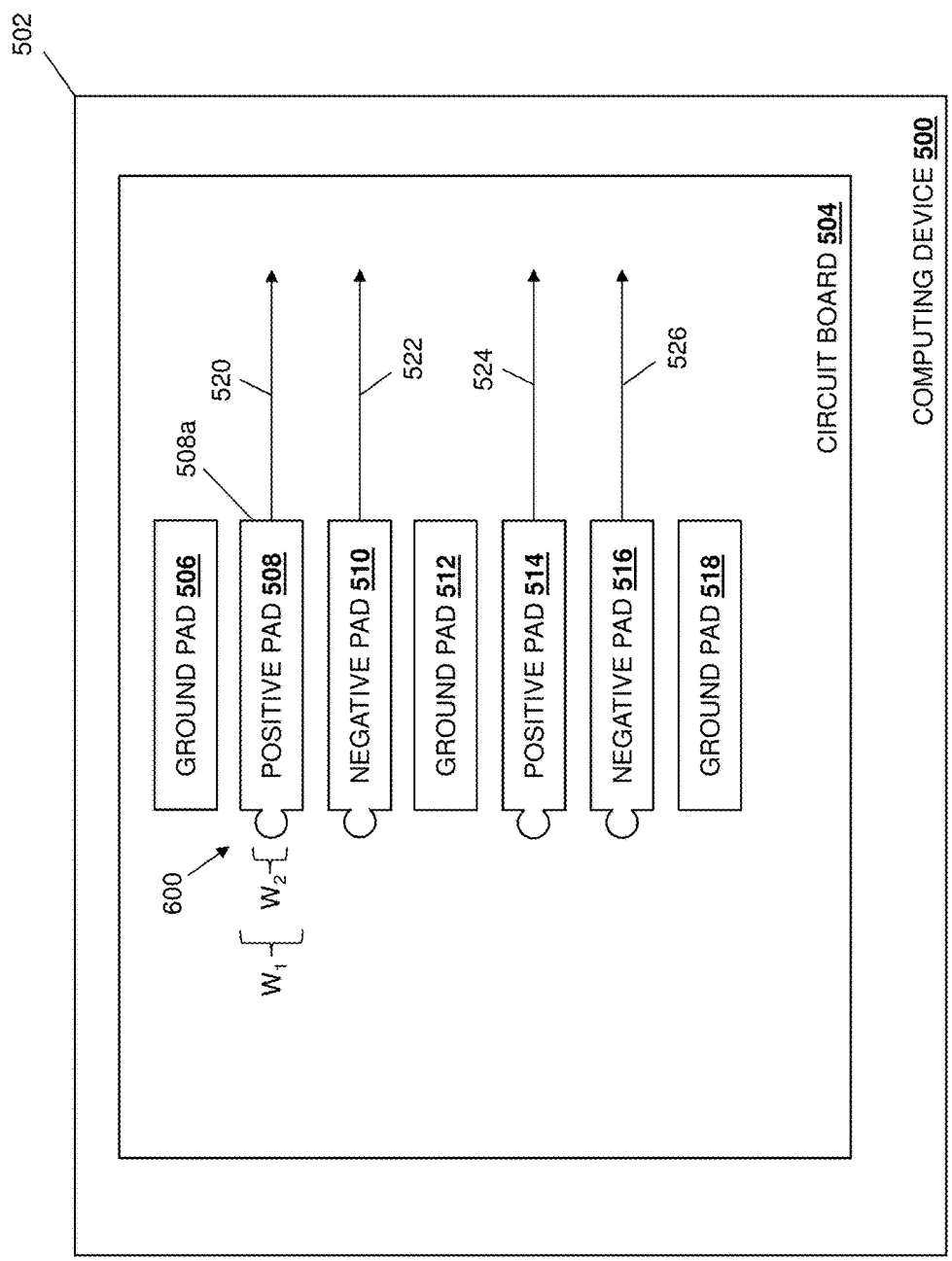
FIG. 6 is a schematic top view illustrating an embodiment of a computing device including a circuit board having connector pads according to the teachings of the present disclosure.

Referring now to FIG. 6, an embodiment of the computing device 500 is illustrated including the circuit board 504 with the connector pads that include the ground pad 506, the positive pad 508, the negative pad 510, the ground pad 512, the positive pad 514, the negative pad 516, and the ground pad 518 discussed in FIG. 5A, but with the irregular ends (e.g., the end 508b on the positive pad 508 discussed above with reference to FIGS. 5A and 5B) modified. For example, in the illustrated embodiment, the positive pad 508 also includes an end 600 that is located opposite the positive pad 508 from the end 508a that receives the signal transmission line 520. In the illustrated embodiment, the end 600 of the positive pad 508 provides a reduction in width of the positive pad 508 from a maximum width $W_1$ to a reduced width $W_2$. In the specific embodiment illustrated in FIG. 6, the end 600 of the positive pad 508 is provided by a smaller, circular-shaped member that extends from the center of the rectangular-shaped positive pad 508 opposite the end 508a, although one of skill in the art in possession of the present disclosure will recognize that other irregular ends on connector pads will fall within the scope of the present disclosure as well. Furthermore, one of skill in the art in possession of the present disclosure will recognize that the negative pad 510, the positive pad 514, and the negative pad 516 are illustrated with irregular ends that may be substantially similar to the end 600 of the positive pad 508 described above, and that any other connector pads on the circuit board 504 may be provided with an irregular end according to any of the teachings of the present disclosure as well.

Figure 7:
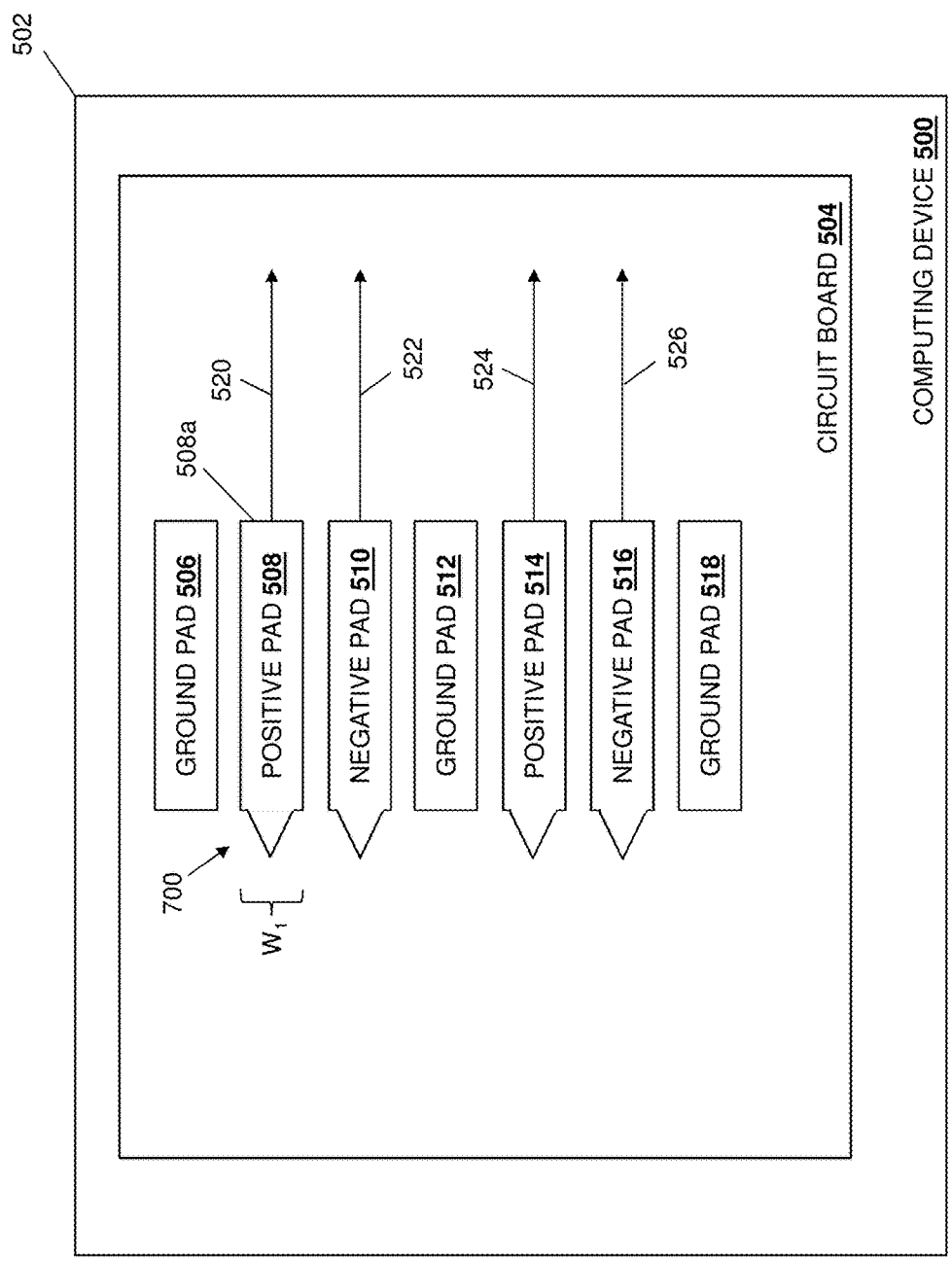
FIG. 7 is a schematic top view illustrating an embodiment of a computing device including a circuit board having connector pads according to the teachings of the present disclosure.

Referring now to FIG. 7, an embodiment of the computing device 500 is illustrated including the circuit board 504 with the connector pads that include the ground pad 506, the positive pad 508, the negative pad 510, the ground pad 512, the positive pad 514, the negative pad 516, and the ground pad 518 discussed in FIG. 5A, but with the irregular ends (e.g., the end 508b on the positive pad 508 discussed above with reference to FIGS. 5A and 5B) modified. For example, in the illustrated embodiment, the positive pad 508 also includes an end 700 that is located opposite the positive pad 508 from the end 508a that receives the signal transmission line 520. In the illustrated embodiment, the end 700 of the positive pad 508 provides a substantially linear reduction in width of the positive pad 508 from a maximum width $W_1$ to a point. In the specific embodiment illustrated in FIG. 7, the end 700 of the positive pad 508 is provided by a triangular shaped member that extends from the center of the rectangular-shaped positive pad 508 opposite the end 508a, with the point of the triangle located opposite the triangular shaped member from the positive pad 508, although one of skill in the art in possession of the present disclosure will recognize that other irregular ends on connector pads will fall within the scope of the present disclosure as well. Furthermore, one of skill in the art in possession of the present disclosure will recognize that the negative pad 510, the positive pad 514, and the negative pad 516 are illustrated with irregular ends that may be substantially similar to the end 700 of the positive pad 508 described above, and that any other connector pads on the circuit board 504 may be provided with an irregular end according to any of the teachings of the present disclosure as well.

Figure 8:
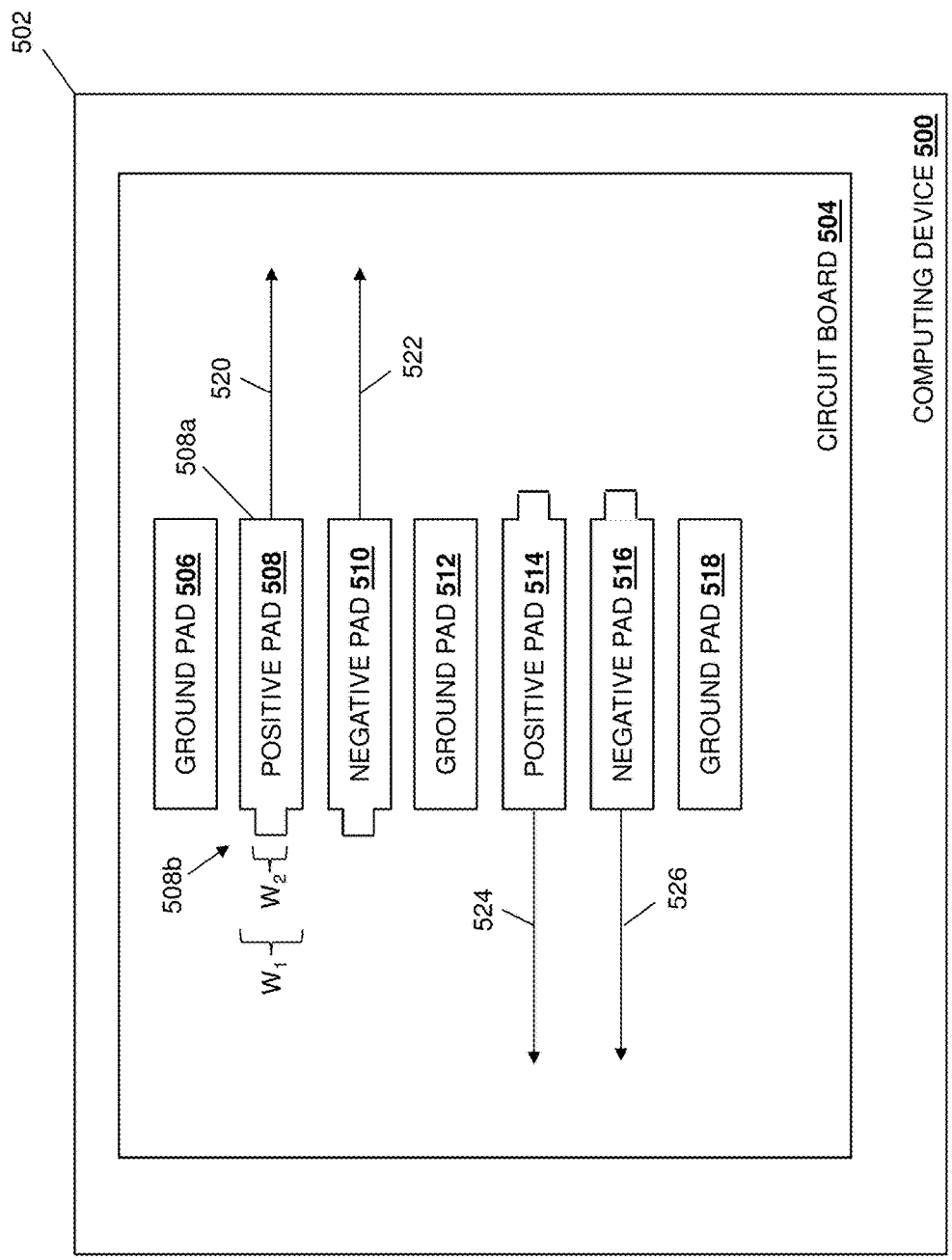
FIG. 8 is a schematic top view illustrating an embodiment of a computing device including a circuit board having connector pads according to the teachings of the present disclosure.

Referring now to FIG. 8, an embodiment of the computing device 500 is illustrated including the circuit board 504 with the connector pads that include the ground pad 506, the positive pad 508, the negative pad 510, the ground pad 512, the positive pad 514, the negative pad 516, and the ground pad 518 discussed in FIG. 5A, but with the signal transmission lines 524 and 526 received by the positive pad 514 and the negative pad 516, respectively, on opposite ends than illustrated in FIG. 5A. FIG. 8 illustrates an embodiment of how irregular ends 508b may be provided on opposite sides of connector pads that are part of the same connector pad array (e.g., on the left side of the positive pad 508 and the negative pad 510, and on the right side of the positive pad 514 and the negative pad 516, from the point of view of FIG. 8), which one of skill in the art in possession of the present disclosure will recognize may be dictated by board features that may, for example, prevent the signal transmission lines from being received by ends on each of the connector pads that are located on the same side of the connector pad array.

Figure 9:
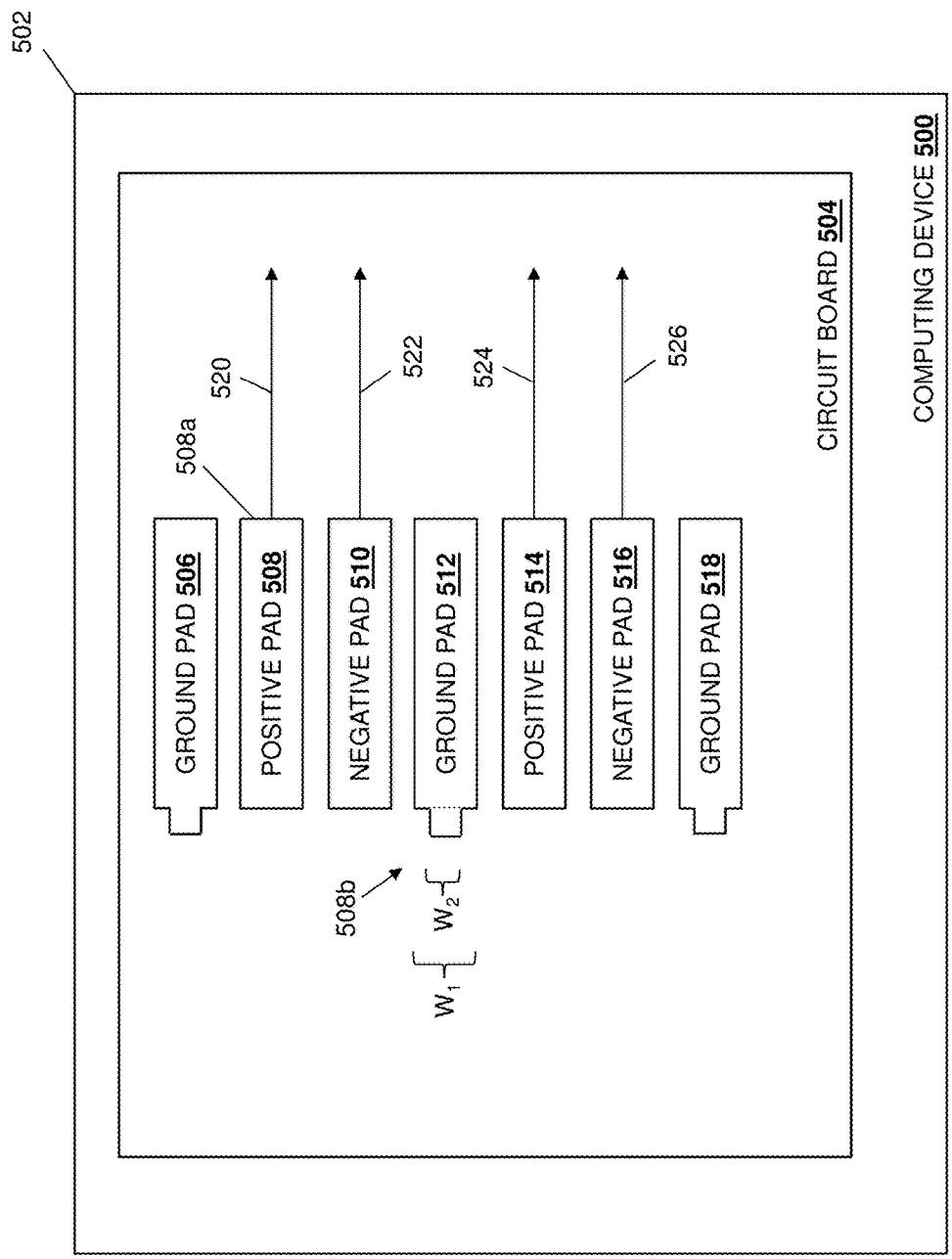
FIG. 9 is a schematic top view illustrating an embodiment of a computing device including a circuit board having connector pads according to the teachings of the present disclosure.

Referring now to FIG. 9, an embodiment of the computing device 500 is illustrated including the circuit board 504 with the connector pads that include the ground pad 506, the positive pad 508, the negative pad 510, the ground pad 512, the positive pad 514, the negative pad 516, and the ground pad 518 discussed in FIG. 5A, but with the reduced width ends 508b provided on the ground pads 506, 512, and 518. FIG. 9 illustrates an embodiment of how irregular ends 508b may be provided on ground pads, rather than positive pads and negative pad, in order to provide mounting indications for those positive pads and negative pads. One of skill in the art in possession of the present disclosure will recognize that providing mounting indications using the ground pads may be helpful in situations where alteration of the signal pads (e.g., the positive pads and negative pads discussed herein) is undesirable (e.g., due to the size of those connector pads having been reduced to some minimum dimensions.)

Figure 10:
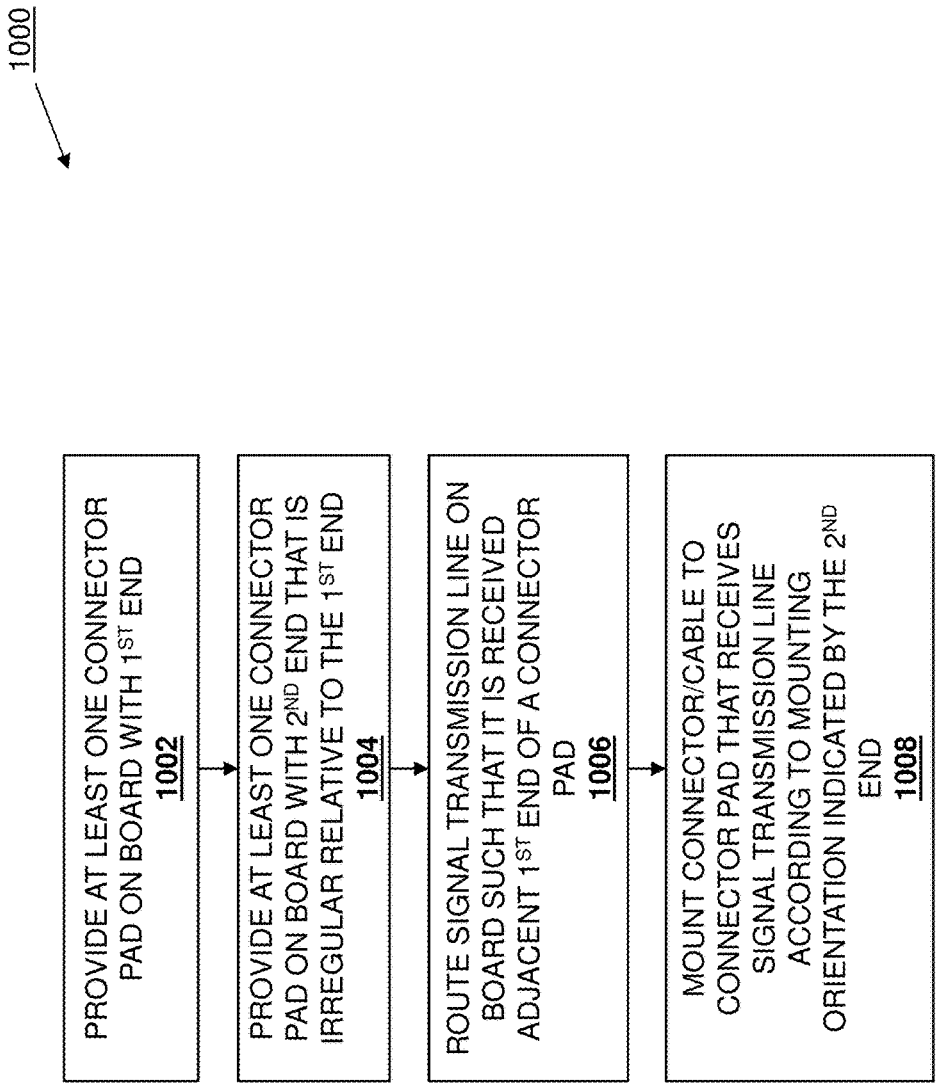
FIG. 10 is a flow chart illustrating an embodiment of a method for mounting connectors to circuit board pads in a desired orientation.

Referring now to FIG. 10, an embodiment of method 1000 for providing an indication of a mounting orientation for a circuit board connector pad is illustrated. In some embodiments, the systems and methods of the present disclosure provide for indications of the mounting orientation for coupling to a connector pad via an irregular end that is provided on that connector pad or on an adjacent connector pad. As would be understood by one of skill in the art in possession of the present disclosure, connector pad dimensions on a circuit board are typically larger than the pin, lead frame, or exposed cable end being mounted thereto in order to provide for assembly tolerances and/or SMT component wetting areas, in consideration of manufacturing and/or alignment variations, and/or in consideration of other mounting element/connector pad issues in order to help ensure that the mounting element may be properly mounted to the connector pad (e.g., within the connector pad footprint to ensure a "good" connection.) As illustrated and discussed above, conventional connector pads are provided as symmetrical rectangles with flat ends that are located opposite the connector pad from each other, and that symmetrical shape may result in the mounting of connectors and/or exposed cable ends to those connectors pads in either of two orientations, one of which introduces an open portion in the transmission path that can resonate and reduce the quality of high speed signals that are transmitted via that connection.

The connector pads of the present disclosure include an irregular/reduced-width end that operates to provide an indication of the proper orientation upon which to mount a connector or exposed cable end to that connector pad or to an adjacent connector pad, and in particular may provide an indication that a signal transmission line is not received by that end of the connector pad, from which the proper mounting orientation of the connector or exposed cable end follows. Furthermore, it has been found that computing device manufacturers typically will not attempt to couple a signal transmission line to the irregular/reduced-width end of the connector pad of the present disclosure, as the opposing, and relatively larger and flatter end of that connector pad provides a much easier and more desirable means for making a connection of the signal transmission line to the connector pad. As such, the connector pads of the present disclosure incentivize computing device manufacturers to route signal transmission lines such that they are received by connector pads at a particular end (e.g., the end opposite that connector pad from its irregular/reduced width end), and also provide an indication of a desired mounting orientation for connectors and/or exposed cable ends to that connector pad that will ensure that any open portion introduced in the transmission path that can resonate and reduce the quality of the high speed signal transmitted via that connector/exposed cable end/connector pad connection is minimized.

The method 1000 begins at block 1002 where at least one connector pad is provided on a board with a first end. In an embodiment, at block 1002, the circuit board 504 may be provided with a connector pad having a first end. For example, with reference to FIGS. 5A, 6, 7, and 9, the positive pad 508 may be provided on the circuit board 504 with the relatively flat (e.g., conventional) end 508a, and any of the negative pad 510, the positive pad 514, and the negative pad 516 may be provided on the circuit board 504 with relatively flat (e.g., conventional) ends that are substantially similar to the relatively flat (e.g., conventional) end 508a discussed above. In another example, with reference to FIG. 8, the positive pad 508 may be provided on the circuit board 504 with the relatively flat (e.g., conventional) end 508a, the negative pad 510 may be provided on the circuit board 504 with a relatively flat (e.g., conventional) end that is substantially similar to the relatively flat (e.g., conventional) end 508a discussed above, and each of the positive pad 514 and the negative pad 516 may be provided on the circuit board 504 with relatively flat (e.g., conventional) ends that are substantially similar to the relatively flat (e.g., conventional) end 508a discussed above but that are located on an opposite side of the connector pad array from the relatively flat (e.g., conventional) ends on the positive pad 508 and the negative pad 510 (e.g., on the left side of FIG. 8 rather than the right side.)

The method 1000 then proceeds to block 1004 where at least one connector pad is provided on the board with a second end that is irregular relative to the first end discussed above with reference to block 1002. In an embodiment, at block 1004, the circuit board 504 may be provided with a connector pad having an irregular second end, and that irregular second end may be provided on the same connector pad that was provided with the first end in block 1002, or a connector pad that is different than the connector pad that was provided with the first end in block 1002.

For example, with reference to FIGS. 5A, 6, and 7, the positive pad 508 may be provided on the circuit board 504 with the irregular/reduced-width end 508b, and any of the negative pad 510, the positive pad 514, and the negative pad 516 may be provided on the circuit board 504 with the irregular/reduced-width ends 600 or 700 illustrated in FIGS. 6 and 7, respectively. As such, in some embodiments, signal connector pads (i.e., any or all of the positive pads and negative pads in the illustrated embodiments) may include opposing ends (i.e., the ends 508a and 508b) that include a first, substantially flat (e.g., conventional) connector pad end, as well as an irregularly dimensioned (e.g., reduced-width) connector pad end.

In another example, with reference to FIG. 8, the positive pad 508 may be provided on the circuit board 504 with the irregular/reduced-width end 508b, the negative pad 510 may be provided on the circuit board 504 with an irregular/reduced-width end that is substantially similar to the irregular/reduced-width end 508b discussed above, and each of the positive pad 514 and the negative pad 516 may be provided on the circuit board 504 with ends that are substantially similar to the irregular/reduced-width end 508b discussed above but that are located on an opposite side of the connector pad array than the irregular/reduced-width ends provided on the positive pad 508 and the negative pad 510 (e.g., on the left side of FIG. 8 rather than the right side.) As such, in some embodiments, each signal connector pad (i.e., the positive pads and negative pads in the illustrated embodiments) may include opposing ends (i.e., the ends 508a and 508b) that include a first, substantially flat (e.g., conventional) connector pad end, as well as a second, irregularly dimensioned (e.g., reduced-width) connector pad end. However, rather than each of the flat (e.g., conventional) connector pad ends being located on a common side of the connector pad array (e.g., on the right side of the connector pad array in the embodiments illustrated in FIGS. 5A, 6, and 7), and each of the irregularly dimensioned (e.g., reduced-width) connector pad ends located on a common side of the connector pad array (e.g., on the left side of the connector pad array in the embodiments illustrated in FIGS. 5A, 6, and 7), any of the connector pads may be provided on the circuit board 504 in different configurations such that any substantially flat (e.g., conventional) connector pad end on one of the connector pads may be located on the same side of the connector pad array as the irregularly dimensioned (e.g., reduced-width) connector pad end on another of the connector pads.

In another example, with reference to FIG. 9, the ground pad 512 may be provided on the circuit board 504 with the irregular/reduced-width end 508b, and each of the ground pads 506 and 518 may be provided on the circuit board 504 with ends that are substantially similar to the irregular/ reduced-width end 508b discussed above. As such, in some embodiments, ground connector pads may include a first, substantially flat (e.g., conventional) connector pad end, as well as a second, irregularly dimensioned (e.g., reduced-width) connector pad end, and may be positioned adjacent at least one signal connector pad (i.e., immediately adjacent any of the positive pads and negative pads in the illustrated embodiments such that no other connector pads are positioned between that ground pad and signal connector pad) to allow the irregularly dimensioned (e.g., reduced-width) connector pad end to provide an indication of a mounting orientation for coupling to its adjacent signal connector pad and, in some embodiments, other signal connector pads. For example, the irregularly dimensioned (e.g., reduced-width) connector pad end on the ground pad 506 may provide an indication of mounting orientation for coupling to the positive pad 508 and, in some embodiments, the negative pad 510. Similarly, the irregularly dimensioned (e.g., reduced-width) connector pad end on the ground pad 512 may provide an indication of mounting orientation for coupling to the positive pad 514 and, in some embodiments, the negative pad 516.

The method 1000 then proceeds to block 1006 where a signal transmission line is routed on the board such that it is received adjacent the first end of a connector pad. In an embodiment, at block 1006, respective signal transmission lines are routed on the circuit board 504 such that they are received by connected pads on the circuit board 504 adjacent their first ends. For example, with reference to FIGS. 5A, 6, 7, and 8, the signal transmission line 520 may be routed on the circuit board 504 such that it is received by the positive pad 508 adjacent its first end 508a that is opposite the positive pad 508 from its irregular/reduced-width end 508b, 600, or 700. Furthermore, the signal transmission lines 522, 524, and 526 may be routed through the circuit board 504 such that they are received by the negative pad 510, the positive pad 514, and the negative pad 516, respectively, adjacent their substantially flat (e.g., conventional) connector pad ends that are opposite those connector pads from their irregular/reduced-width ends. As discussed above, the difference between the irregular/reduced-width connector pad end and the substantially flat (e.g., conventional) connector pad end on each signal connector pad illustrated in FIGS. 5A, 6, and 7 provides an indication that signal transmission lines should be received by those signal connector pads adjacent the substantially flat (e.g., conventional) connector pad ends, both because of that difference providing a known indication, and because the irregular/reduced-width connector pad end provides a non-ideal location for receiving signal transmission lines. Furthermore, FIG. 8 illustrates how connector pads may be oriented such that different signal transmission lines may be received by respective signal connector pads adjacent their substantially flat (e.g., conventional) connector pad ends that are located on different sides of the connector pad array.

In another example, with reference to FIG. 9, the signal transmission line 520 may be routed on the circuit board 504 such that it is received by the positive pad 508 adjacent its first end 508a that is opposite the connector pad array from the irregular/reduced-width end on the ground pad 506. Furthermore, the signal transmission lines 522, 524, and 526 may be routed through the circuit board 504 such that they are received by the negative pad 510, the positive pad 514, and the negative pad 516, respectively, adjacent their substantially flat (e.g., conventional) connector pad ends that are opposite the connector pad array from the irregular/reduced-width ends on the ground pads 506 and 512. As discussed above, the difference between the irregular/reduced-width connector pad end and the substantially flat (e.g., conventional) connector pad end on each ground connector pad illustrated in FIG. 9 provides an indication that signal transmission lines should be received by the adjacent signal connector pad(s) adjacent the substantially flat (e.g., conventional) connector pad ends on those signal connector pads that are opposite the connector pad array from the irregular/reduced-width connector pad ends on the adjacent ground pad.

Figure 11:
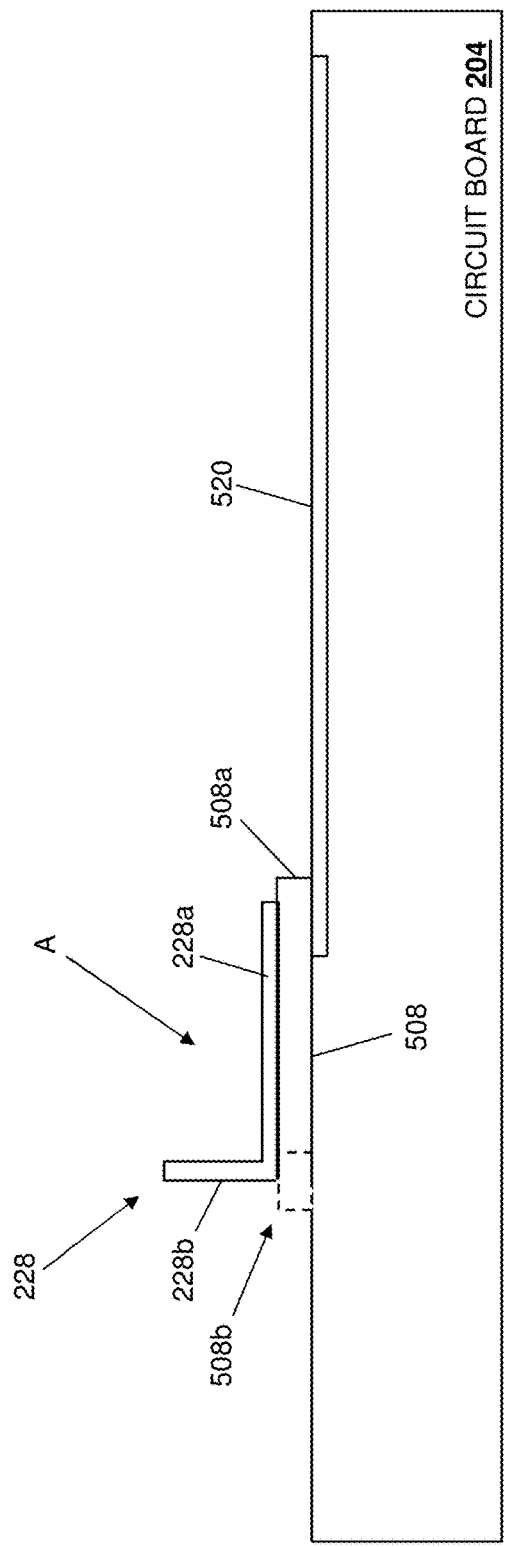
FIG. 11 is a schematic cross-sectional view illustrating an embodiment of a connector mounted to any of the signal connector pads of the present disclosure of in a first orientation.

The method 1000 then proceeds to block 1008 where a connector/cable is mounted to a connector pad that receives a signal transmission line according to the mounting orientation indicated by the second end. With reference to FIG. 11, an embodiment of the connector lead frame 228 mounted to the positive pad 508 in the first orientation A is illustrated, and one of skill in the art in possession of the present disclosure will recognize from the discussion above how a user mounting the connector lead frame 228 to the positive pad 508 may immediately recognize from the irregular/reduced-width connector pad end 508b of the positive pad 508 that the signal transmission line 520 is received by that positive pad 508 adjacent the substantially flat (e.g., conventional) connector pad end 508a, and may orient the connector lead frame 228 appropriately in order to mount the connector lead frame 228 to the positive pad 508 in the first mounting orientation A. Similarly, one of skill in the art in possession of the present disclosure will recognize from the discussion above how a user mounting the connector lead frame 228 to the positive pad 508 may immediately recognize from the irregular/reduced-width connector pad end 508b on an adjacent ground pad that the signal transmission line 520 is received by the positive pad 508 adjacent the end 508a, and may orient the connector lead frame 228 appropriately in order to mount it to the positive pad in the first mounting orientation A. As such, the transmission of high speed signals via the connector lead frame 228 and the positive pad 508 in the first mounting orientation A will produce an eye diagram similar to the eye diagram 300 illustrated in FIG. 3A.

Figure 12:
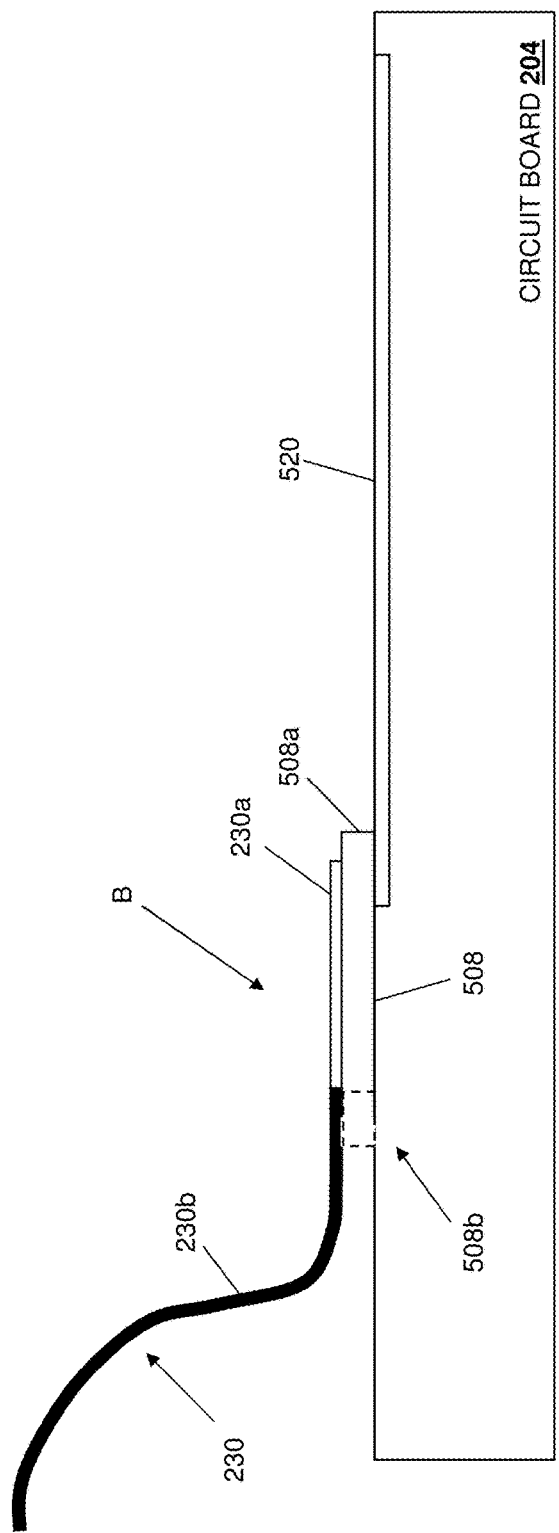
FIG. 12 is a schematic cross-sectional view illustrating an embodiment of a cable mounted to any of the signal connector pads of the present disclosure in a first orientation.

With reference to FIG. 12, an embodiment of the cable 230 mounted to the positive pad 508 in the first orientation B is illustrated, and one of skill in the art in possession of the present disclosure will recognize from the discussion above how a user mounting the exposed connector end 230a to the positive pad 508 may immediately recognize from the irregular/reduced-width connector pad end 508b of the positive pad 508 that the signal transmission line 520 is received by that positive pad 508 adjacent the substantially flat (e.g., conventional) connector pad end 508a, and may orient the exposed connector end 230a appropriately in order to mount the exposed connector end 230a to the positive pad 508 in the first mounting orientation B. Similarly, one of skill in the art in possession of the present disclosure will recognize from the discussion above how a user mounting the exposed connector end 230a to the positive pad 508 may immediately recognize from the irregular/reduced-width connector pad end 508b on an adjacent ground pad that the signal transmission line 520 is received by the positive pad 508 adjacent the end 508a, and may orient the exposed connector end 230a appropriately in order to mount it to the positive pad in the first mounting orientation B. As such, the transmission of high speed signals via the cable 230 and the positive pad 508 in the first mounting orientation B will produce an insertion loss chart 400 with cable insertion losses similar to those marked as "A" in FIG. 4.

Thus, systems and methods have been described that provide connector pads on a circuit board that include an irregular/reduced-width end that operates to provide an indication of the proper orientation upon which to mount a connector or exposed cable end to that connector pad or to an adjacent connector pad. In particular, such irregular/reduced-width connector pad ends may provide an indication that a signal transmission line is not received by that end of the connector pad, as it has been found that computing device manufacturers typically will not attempt to couple a signal transmission line to the irregular/reduced-width connector pad end of the connector pad as the opposing, and relatively larger and flatter, end of that connector pad provides a much easier and more desirable means for making a connection of the signal transmission line to the connector pad. As such, the connector pads of the present disclosure incentivize computing device manufacturers to route signal transmission lines such that they are received by connector pads at a particular end (e.g., the end opposite that connector pad from the irregular/reduced width end), which results in an indication being provided to users of a desired mounting orientation for coupling connectors and/or exposed cable ends to that connector pad that will ensure that no open portion is introduced in the transmission path that can resonate and reduce the quality of the high speed signal transmitted via that connector/exposed cable end/connector pad connection.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A circuit board pad mounting orientation system, comprising:
   a board;
   a signal transmission line included on the board;
   a plurality of connector pads that are positioned on the board and that include:
      at least one connector pad that receives the signal transmission line adjacent a first end of that connector pad; and
      at least one connector pad that includes a second end that provides a reduction in a width of that connector pad to indicate a mounting orientation for coupling to the connector pad that receives the signal transmission line; and
   one of an orientation-dependent connector or a cable mounted to the at least one connector pad that receives the signal transmission line, wherein the one of the orientation-dependent connector or the cable is oriented according to the mounting orientation indicated by the second end.

2. The system of claim 1, wherein a first connector pad receives the signal transmission line and includes the first end, and wherein that first connector pad includes the second end that is opposite the first connector pad from the first end and that provides the reduction in the width of the first connector pad to indicate the mounting orientation for coupling to the first connector pad.

3. The system of claim 1, wherein a first connector pad receives the signal transmission line and includes the first end, and wherein a second connector pad that is different than the first connector pad includes the second end that provides the reduction in the width of the second connector pad to indicate the mounting orientation for coupling to the first connector pad.

4. The system of claim 3, wherein the second connector pad is a ground connector pad that is coupled to ground.

5. The system of claim 3, wherein the second connector pad is located adjacent the first connector pad such that no other connector pads are positioned between the first connector pad and the second connector pad.

6. The system of claim 1, wherein the orientation-dependent connector includes:
   a mounting portion mounted to the at least one connector pad that receives the signal transmission line; and
   a lead portion coupled to the mounting portion and that is orientation-dependent.

7. The system of claim 1, wherein the cable includes:
   a connector end mounted to the at least one connector pad that receives the signal transmission line; and
   a shielded cable portion coupled to the connector end.

8. An Information Handling System (IHS), comprising:
   a circuit board;
   a processing system mounted to the circuit board;
   a memory system mounted to the circuit board and coupled to the processing system through the circuit board;
   a signal transmission line included on the circuit board and coupled to the processing system;
   a plurality of connector pads that are positioned on the circuit board and that include:
      at least one connector pad that receives the signal transmission line adjacent a first end of that connector pad; and
      at least one connector pad that includes a second end that provides a reduction in a width of that connector pad to indicate a mounting orientation for coupling to the connector pad that receives the signal transmission line; and
   one of an orientation-dependent connector or a cable mounted to the at least one connector pad that receives the signal transmission line, wherein the one of the orientation-dependent connector or the cable is oriented according to the mounting orientation indicated by the second end.

9. The IHS of claim 8, wherein a first connector pad receives the signal transmission line and includes the first end, and wherein that first connector pad includes the second end that is opposite the first connector pad from the first end and that provides the reduction in the width of the first connector pad to indicate the mounting orientation for coupling to the first connector pad.

10. The IHS of claim 8, wherein a first connector pad receives the signal transmission line and includes the first end, and wherein a second connector pad that is different than the first connector pad includes the second end that provides the reduction in the width of the second connector pad to indicate the mounting orientation for coupling to the first connector pad.

11. The IHS of claim 10, wherein the second connector pad is a ground connector pad that is coupled to ground.

12. The IHS of claim 10, wherein the second connector pad is located adjacent the first connector pad such that no other connector pads are positioned between the first connector pad and the second connector pad.

13. The IHS of claim 8, wherein the orientation-dependent connector includes:
   a mounting portion mounted to the at least one connector pad that receives the signal transmission line; and a lead portion coupled to the mounting portion and that is orientation-dependent.

14. A method for providing an indication of a mounting orientation for a circuit board connector pad, comprising:
providing, on a board, at least one connector pad that includes a first end;
providing, on the board, at least one connector pad that includes a second end that includes a reduced width relative to the first end;
routing, on a board, a signal transmission line such that the signal transmission line is received adjacent the first end of the at least one connector pad;
providing, via the second end of the at least one connector pad having the reduced width relative to the first end, an indication of a mounting orientation for coupling to the connector pad that receives the signal transmission line; and
mounting, to the at least one connector pad that receives the signal transmission line, one of an orientation-dependent connector or a cable according to the mounting orientation indicated by the second end.

15. The method of claim 14, wherein a first connector pad receives the signal transmission line and includes the first end, and wherein that first connector pad includes the second end that is opposite the first connector pad from the first end and that provides the reduction in the width of the first connector pad to indicate the mounting orientation for coupling to the first connector pad.

16. The method of claim 14, wherein a first connector pad receives the signal transmission line and includes the first end, and wherein a second connector pad that is different than the first connector pad includes the second end that provides the reduction in the width of the second connector pad to indicate the mounting orientation for coupling to the first connector pad.

17. The method of claim 16, wherein the second connector pad is a ground connector pad that is coupled to ground.

18. The method of claim 16, wherein the second connector pad is located adjacent the first connector pad such that no other connector pads are positioned between the first connector pad and the second connector pad.

19. The method of claim 14, wherein the orientation-dependent connector includes:
a mounting portion for mounting to the at least one connector pad that receives the signal transmission line; and
a lead portion coupled to the mounting portion and that is orientation-dependent.

20. The method of claim 14, wherein the cable includes:
a connector end for mounting to the at least one connector pad that receives the signal transmission line; and
a shielded cable portion coupled to the connector end.

* * * * *